(12) United States Patent
Yednak, III

(10) Patent No.: US 11,869,782 B2
(45) Date of Patent: Jan. 9, 2024

(54) SYSTEM AND APPARATUS FOR A VALVE ASSEMBLY

(71) Applicant: ASM IP Holding B.V., Almere (NL)

(72) Inventor: Andrew Michael Yednak, III, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/981,647

(22) Filed: Nov. 7, 2022

(65) Prior Publication Data

US 2023/0143103 A1 May 11, 2023

Related U.S. Application Data

(60) Provisional application No. 63/278,010, filed on Nov. 10, 2021.

(51) Int. Cl.
| | | |
|---|---|---|
| *F16K 27/12* | (2006.01) | |
| *H01L 21/67* | (2006.01) | |
| *F16K 3/24* | (2006.01) | |
| *F16L 55/132* | (2006.01) | |

(52) U.S. Cl.
CPC .......... *H01L 21/67253* (2013.01); *F16K 3/24* (2013.01); *F16K 27/12* (2013.01); *F16L 55/132* (2013.01); *H01L 21/67248* (2013.01)

(58) Field of Classification Search
CPC ......... H01L 21/67253; H01L 21/67248; F16K 3/24; F16K 27/12; F16L 55/132
USPC ........................................ 251/366–367, 331
See application file for complete search history.

(56) References Cited

U.S. PATENT DOCUMENTS

| | | | | |
|---|---|---|---|---|
| 1,069,067 | A * | 7/1913 | Huxford | ................... F16K 1/14 251/284 |
| 2,360,603 | A * | 10/1944 | Ward | ..................... B65D 83/75 222/509 |
| 3,095,904 | A * | 7/1963 | Thaning | .................... F16K 7/20 251/335.1 |
| 4,997,014 | A * | 3/1991 | Weiler | .................. F16K 27/029 141/237 |
| 5,009,778 | A * | 4/1991 | Nickerson | .............. G01N 30/20 210/659 |
| 7,694,662 | B2 | 4/2010 | Onuma | |
| 8,517,338 | B2 * | 8/2013 | Hunnekuhl | ............. F16K 7/126 251/367 |
| 10,767,789 | B2 | 9/2020 | Shugrue | |
| 2022/0090687 | A1 | 3/2022 | Chien | |

FOREIGN PATENT DOCUMENTS

| | | |
|---|---|---|
| CN | 209115749 U | 7/2019 |
| CN | 211203084 U | 8/2020 |
| CN | 109312874 B | 11/2020 |
| CN | 110296267 B | 2/2021 |
| DE | 102010034304 B4 | 2/2020 |
| JP | 2008121703 A | 5/2008 |

(Continued)

*Primary Examiner* — John Bastianelli
(74) *Attorney, Agent, or Firm* — Snell & Wilmer L.L.P.

(57) ABSTRACT

A valve assembly may provide a body comprising a bottom portion and a top portion having a threaded region, a closing mechanism situated above the top portion of the body, an actuator in communication with the closing mechanism, a nut configured to attach to the threaded region, and a threaded hole extending into at least one of the bottom portion of the body or the nut.

18 Claims, 4 Drawing Sheets

(56) References Cited

FOREIGN PATENT DOCUMENTS

| KR | 200387702 | Y1 | 6/2005 |
| KR | 101295885 | B1 | 8/2013 |
| KR | 20150034830 | A | 4/2015 |
| WO | 2011150106 | A1 | 12/2011 |
| WO | 2014019553 | A1 | 2/2014 |
| WO | 2016070470 | A1 | 5/2016 |
| WO | 2019144228 | A1 | 8/2019 |

* cited by examiner

SYSTEM AND APPARATUS FOR A VALVE ASSEMBLY

CROSS-REFERENCE TO RELATED APPLICATIONS

This application is a nonprovisional of, and claims priority to and the benefit of, U.S. Provisional Patent Application No. 63/278,010, filed Nov. 10, 2021 and entitled "SYSTEM AND APPARATUS FOR A VALVE ASSEMBLY," which is hereby incorporated by reference herein.

FIELD OF INVENTION

The present disclosure generally relates to a system and apparatus for a valve assembly. More particularly, the present disclosure relates to a system and a valve assembly used during the fabrication of semiconductor devices.

BACKGROUND OF THE DISCLOSURE

Valve assemblies may be used to control the flow of various chemicals (such as liquids and gases) through a pipe system during the fabrication of semiconductor devices. During the fabrication process, the temperature of the chemical flowing through the pipe system and valve assemblies may be regulated. For example, the chemical flowing through the pipe system and valve assemblies may be heated to a particular temperature, and precise monitoring of the temperature of the chemical may be desired to achieve optimal semiconductor device structures. Conventional systems provide various temperature monitoring equipment and heating equipment throughout the chemical flow path that operate together to achieve the desired temperature. However, the heating equipment may not efficiently heat portions of the chemical flow path and the temperature monitoring equipment may not accurately detect the temperature of portions of the flow path, such as those that extend away from a heating source. Accordingly, some portions of the flow path may have little or no temperature regulation.

SUMMARY OF THE DISCLOSURE

A valve assembly may provide a body comprising a bottom portion and a top portion having a threaded region, a closing mechanism situated above the top portion of the body, an actuator in communication with the closing mechanism, a nut configured to attach to the threaded region; and a threaded hole extending into at least one of the bottom portion of the body or the nut.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

FIG. 1 representatively illustrates a perspective view of a valve assembly in accordance with an exemplary embodiment of the present technology;

Figure 1:
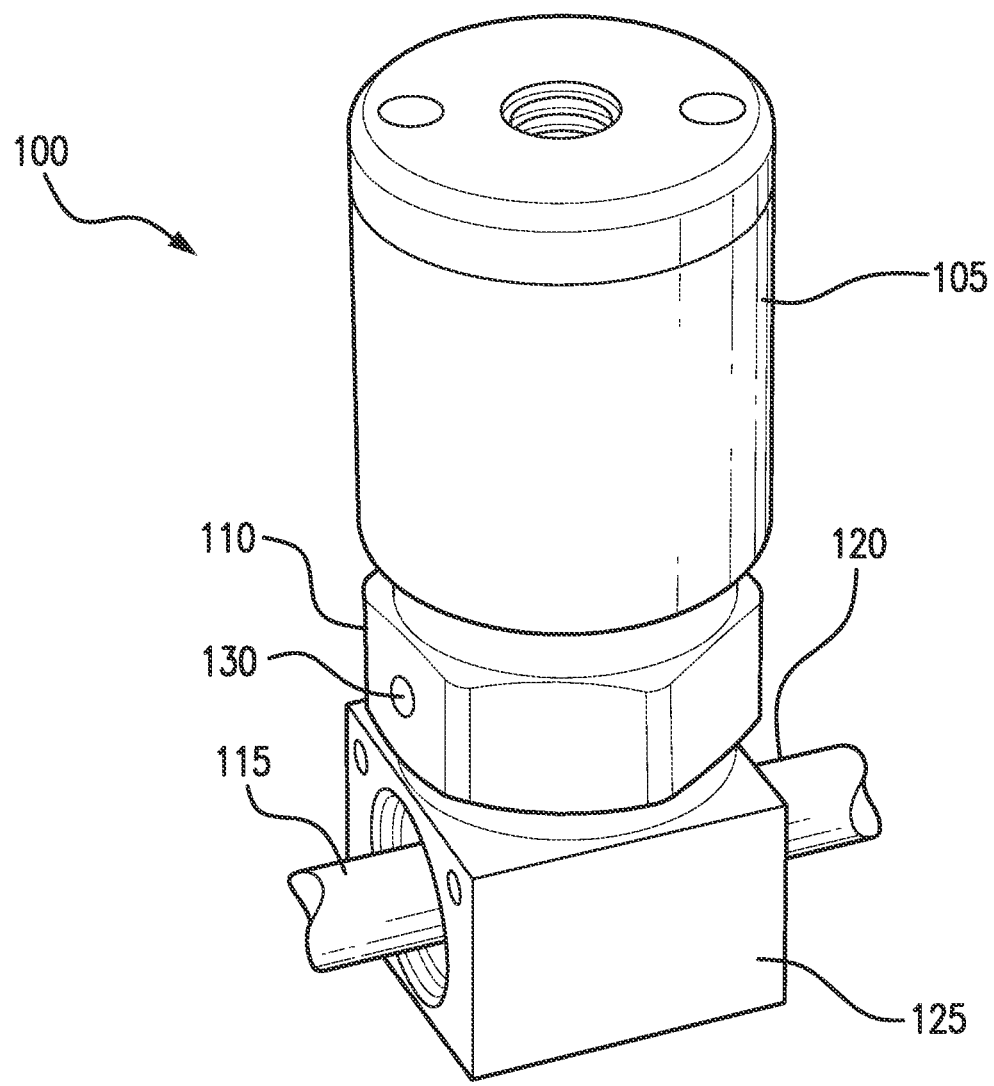

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of semiconductor processing system in accordance with the present disclosure is shown in FIG. 4 and is designated generally by reference character 400. Other examples of semiconductor processing systems in accordance with the present disclosure, or aspects thereof, are provided in FIGS. 1-3, as will be described. The systems and methods of the present disclosure may be used for controlling chemical flow through a flow path and monitoring the temperature of the chemical in the flow path during semiconductor processing, though the present disclosure is not limited to use in semiconductor processing.

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of stated features.

The present disclosure generally relates to valve assembly used to control the flow of a chemical. In addition, some aspects of the present technology are generally related to a valve assembly configured for more accurate temperature monitoring.

Referring to FIG. 4, a system 400 may comprise a vessel 405 containing a chemical, such as a liquid or gas. The system 400 may further comprise a pipe system 410 connecting the vessel 405 to a reaction chamber 415. The pipe system 410 may be configured to flow the chemical from the vessel 405 to the reaction chamber 415. The pipe system 410 may comprise a valve assembly 100 to control the flow of the chemical from the vessel 405 to the reaction chamber 415.

In various embodiments, the system 400 may further comprise a temperature regulation system configured to monitor the temperature of the chemical throughout the system 400 and heat the pipe system 410. For example, the temperature regulation system may comprise a heating source (not shown), such as a heater jacket, configured to wrap around the exterior of the pipe system 410 and/or the vessel 405 to heat the pipe system 410 and/or vessel 405.

In various embodiments, the temperature regulation system may further comprise a temperature sensor, such as a thermocouple, configured to measure the temperature of the chemical in the pipe system 410. The temperature sensor may generate a sensor signal corresponding to the temperature of the chemical in the pipe system 410. For example, in an exemplary embodiment, the system 400 may comprise a first thermocouple 425 to measure the temperature of the chemical at a first location along the flow path of the chemical and a second thermocouple 420 to measure the temperature of the chemical at a second location along the flow path of the chemical. In such a case, each thermocouple 420, 425 may generate an independent sensor signal corresponding to the particular attachment location of the thermocouple. The temperature regulation system may further comprise a processor 430 or other suitable control system configured to receive the sensor signal and respond to the sensor signal by increasing/decreasing the temperature of the heating source in order to achieve a desired temperature of the chemical in the pipe system 410.

In various embodiments, the valve assembly 100 may be configured to open and close according to an electrical signal or by a mechanical mechanism. For example, the valve assembly 100 may comprise a pneumatically-controlled valve, a solenoid-controlled valve, or any suitable valve control style. In addition, the valve assembly 100 may comprise a diaphragm valve, plug valve, needle valve, or the like. The particular valve type may be selected according to the particular application and/or system. For example, a particular valve may be more suitable for a particular application based on the valve specifications, such as flow rate, temperature rating, pressure rating, and the like.

Figure 2:
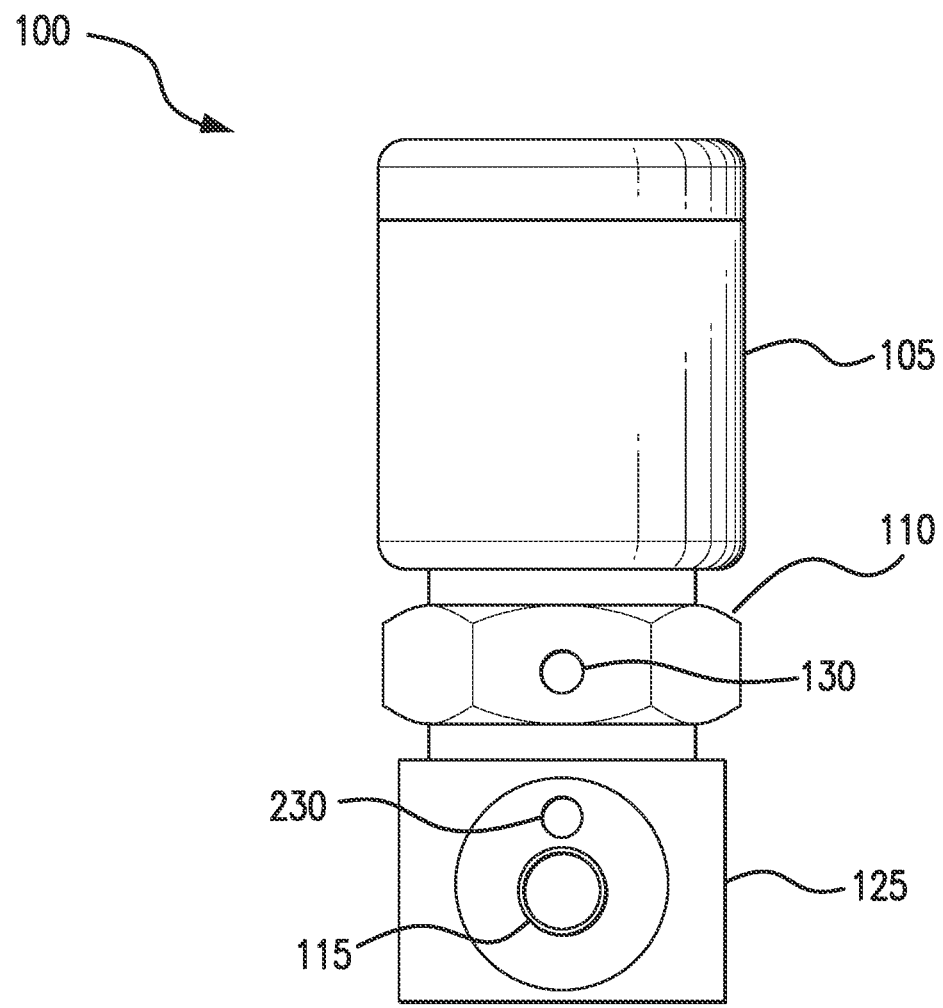
FIG. 2 is a side view of the valve assembly in accordance with an exemplary embodiment of the present technology.
Figure 3:
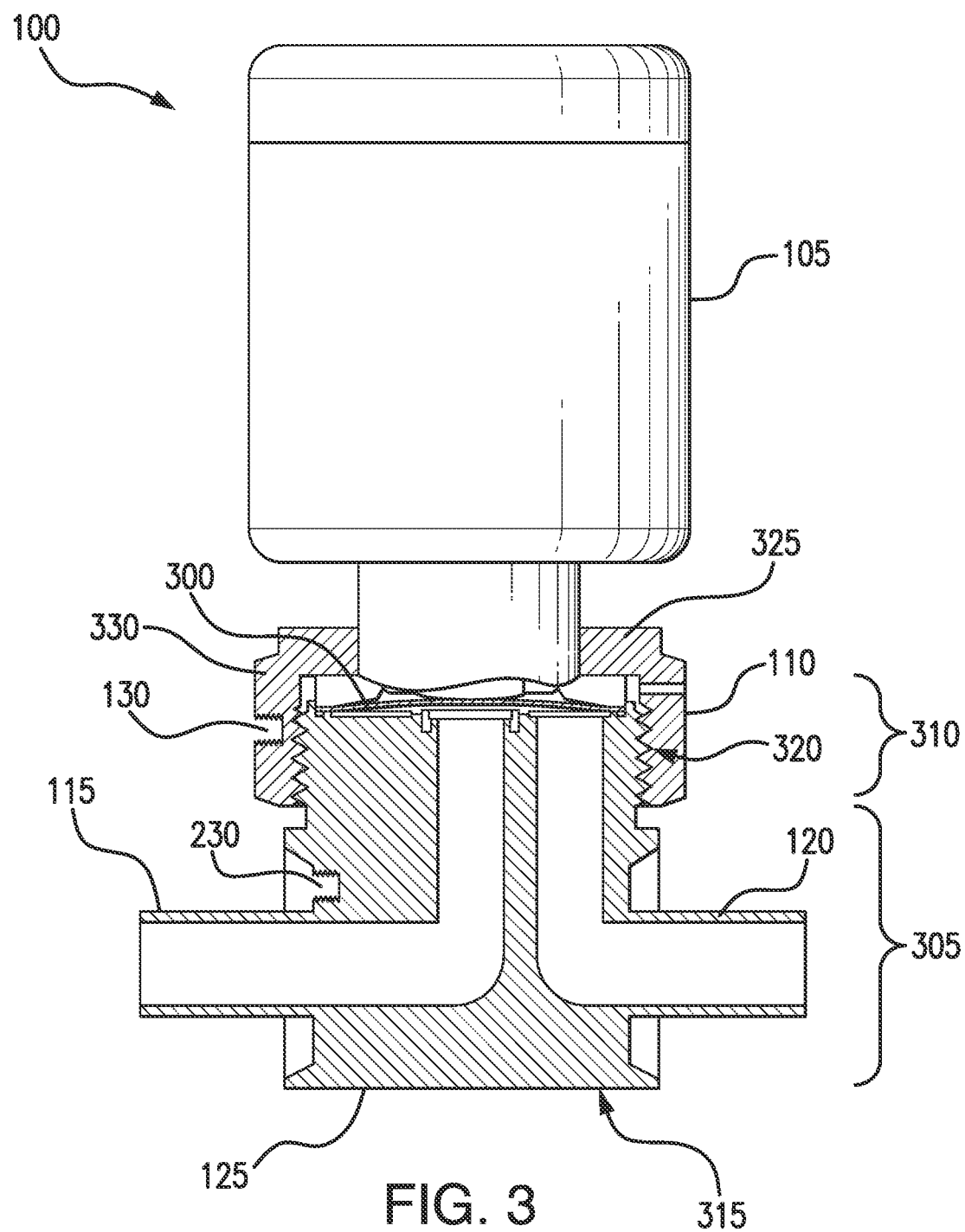
FIG. 3 is a cut-away view of a portion of the valve assembly in accordance with an exemplary embodiment of the present technology.
Figure 4:
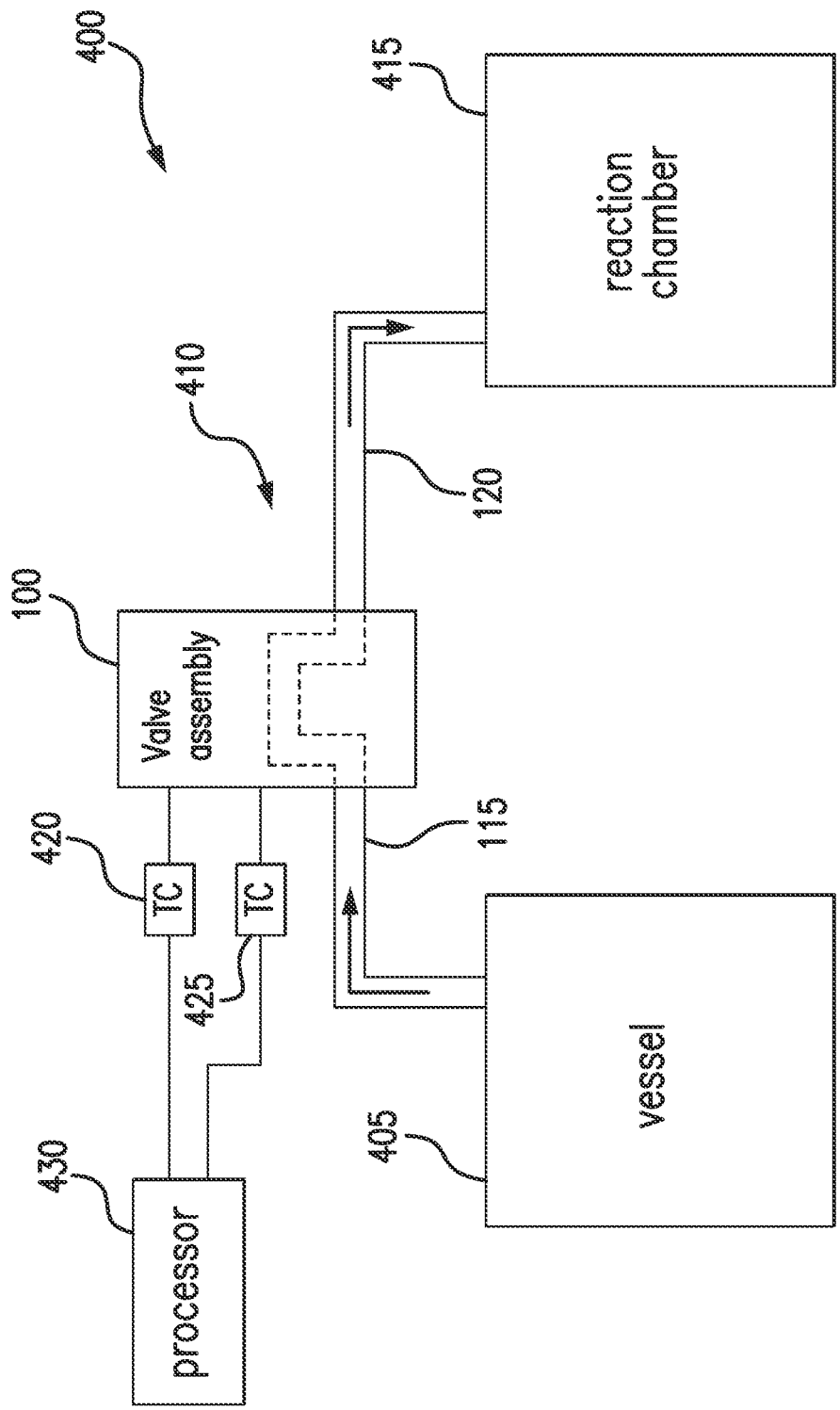
FIG. 4 illustrates a partial view of an example of semiconductor processing system in accordance with the present disclosure.

In various embodiments, and referring to FIGS. 1-3, the valve assembly 100 may comprise a body 125 suitable for mounting to a surface of an object, such as the reaction chamber 415. The body 125 may be formed of any suitable material, such as aluminum, stainless steel, or the like. In various embodiments, the body 125 may comprise a bottom portion 305 and a top portion 310, wherein the top portion 310 is located directly above the bottom portion 305. In an exemplary embodiment, the top portion 310 of the body 125 may comprise an outer threaded region 320 (i.e., a male threaded connection). In addition, the body 125 may comprise mounting holes (not shown) on a bottom surface 315 to attach or otherwise secure the valve assembly 100 to a surface of an object.

In various embodiments, the valve assembly 100 may further comprise a first pipe 115 and a second pipe 120. The first pipe 115 may be an inlet pipe and the second pipe 120 may be an outlet pipe. For example, the chemical may enter the valve assembly 100 via the first pipe 115 and exit the valve assembly 120 via the second pipe 120.

In an exemplary embodiment, the first pipe 115 extends into the bottom portion 305 and upwards into the top portion 310. Similarly, the second pipe 120 extends into the bottom portion 305 and upwards into the top portion 310. For example, the first pipe 115 may be arranged to extend into a first side of the bottom portion 305 of the body 125, and the second pipe 120 may be arranged to extend into a second side, opposite the first side, of the bottom portion 305 of the body 125.

In various embodiments, the valve assembly 100 may further comprise a first hole 230. The first hole 230 may be located in the bottom portion 305 of the body 125 and directly above the first pipe 115. In various embodiments, the first hole 230 may be separated from the first pipe 115 by a distance that prevents the thermocouple from breaking through the wall of the first hole 230. For example, the first hole 230 may be separated from the first pipe 115 by a distance of approximately 1 mm. However, in other cases, the first hole 230 may be separated from the first pipe 115 may a distance of approximately 0.5 mm, or any feasible distance. In various embodiments, the first hole 230 may comprise a threaded inner surface (i.e., a female threaded connection). The threaded inner surface may be used to secure or otherwise attach a first thermocouple 425 or other suitable temperature sensor to the valve assembly 100. For example, the first thermocouple 425 may comprise a threaded connection (e.g., a male threaded connection) suitable for mating with the first hole 230.

In an exemplary embodiment, the first hole 230 may have any suitable diameter that does not interfere with the first pipe 115. Accordingly, the first hole 230 may have any diameter size based on the overall size of the body 125 and/or the particular valve type of the valve assembly. For example, the first hole 230 may have a diameter in the range of approximately 1 mm to approximately 6 mm.

In an exemplary embodiment, the first hole 230 may have any suitable depth so as to not interfere with or break through into the first pipe 115. Accordingly, the first hole 230 may have a depth based on the overall size of the body 125 and/or the particular valve type of the valve assembly. For example, the first hole 230 may have a depth in the range of approximately 1 mm to approximately 6 mm.

In various embodiments, the valve assembly 100 may further comprise an actuator 105 in communication with and configured to operate (open/close) a mechanism 300 (i.e., opening/closing mechanism). The mechanism 300 may be configured to open and close the flow path between the first pipe 115 and the second pipe 120. The actuator 105 may be controlled electrically or mechanically based on the control style of the valve assembly, as described above. In addition, the mechanism 300 may comprise a diaphragm, a plug, a needle, or the like, and may be based on the desired valve type.

In various embodiments, the mechanism 300 may be positioned at or above the top portion 310 of the body 125. For example, and referring to FIG. 3, the mechanism 300, in this case a diaphragm, is positioned horizontally on top a top surface of the body 125 and situated to extend across both an opening of the first pipe 115 and an opening of the second pipe 120. Accordingly, the actuator 105 may raise the diaphragm to open the flow path between the first pipe 115 and the second pipe 120, and lower the diaphragm to close the flow path between the first pipe 115 and the second pipe 120.

In alternative embodiments, the mechanism 300 may be within the body 125. For example, in the case of a needle valve or a plug valve.

In various embodiments, the valve assembly may further comprise a nut 110 configured to secure the mechanism 300 and/or the actuator 105 to the body 125. In various embodiments, the nut 110 may comprise a top plate 325 and a side member 330 extending downward from the top plate 325. The top plate 325 may be parallel with the top surface of the body 125. In an exemplary embodiment, the side member may comprise an inner threaded region (i.e., a female threaded connection) configured to thread onto the outer threaded region 320 of the top portion 310 of the body 125.

In various embodiments, the nut 110 may further comprise a second hole 130. In various embodiments, the second hole 130 may be located adjacent to the mechanism 300. For example, the second hole 130 may be separated from the mechanism 300 by any suitable distance so as to not interfere with the mechanism 300, the threaded region 320 and/or the nut 110. Accordingly, the distance separating the second hole 130 and the mechanism may be based on the overall size of the body 125 and/or the particular valve type of the valve assembly. For example, the second hole 130 may be separated from the mechanism by about 1 mm. In various embodiments, the second hole 130 may comprise a threaded inner surface (i.e., a female threaded connection). The threaded inner surface of the second hole 130 may be used to secure or otherwise attach a second thermocouple 420 or other suitable temperature sensor to the valve assembly 100. For example, the second thermocouple 420 may comprise a threaded connection (e.g., a male threaded connection) suitable for mating with the second hole 130.

In an exemplary embodiment, the second hole 130 may have a diameter in the range of approximately 1 mm to approximately 6 mm. However, in other embodiments, the second hole 130 may have any diameter size based on the overall size of the nut 110 and/or the particular valve type and design of the valve assembly.

In an exemplary embodiment, the second hole 130 may have a depth in the range of approximately 1 mm to approximately 6 mm. However, in other embodiments, the second hole 130 may have a depth based on the overall size of the nut 110 and/or the particular valve type and design of the valve assembly.

In operation, and referring to FIGS. 1-4, the system 400 may operate the valve assembly 100 to allow the chemical to flow through the valve assembly 100. For example, when the valve assembly 100 is open, the chemical may flow from the vessel 405 to the reaction chamber 415 via the first and second pipes 120. In addition, the chemical may flow through a number of other valves and/or pipes in the flow path from the vessel 405 to the reaction chamber 415.

During operation, the first thermocouple 425 and/or the second thermocouple 420 may, either periodically (e.g., every 2, 3, 4, etc. seconds) or continuously, measure the temperature of the chemical in the valve assembly 100. The first thermocouple 425 and/or the second thermocouple 420 may measure the temperature of the chemical when the valve assembly 100 is open or closed. The first thermocouple 425 and/or the second thermocouple 420 may generate a sensor signal and transmit the sensor signal to the processor 430. The processor 430 may analyze the sensor signal and generate a control signal to operate the heating source in response to the temperature signal. For example, the processor 430 may determine that temperature measured by the thermocouple (e.g., the first thermocouple 425) is not desirable (i.e., either too high or too low). In response, the processor 430 may generate a control signal to either increase the temperature of the heating source (in the case where the measured temperature is too low) or decrease the temperature of the heating source (in the case where the measured temperature is too high).

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The invention claimed is:

1. A valve assembly, comprising:
   a body comprising:
   a bottom portion comprising a bottom surface; and
   a top portion comprising:
      a top surface opposite the bottom surface; and
      a first threaded region arranged between the bottom and top surfaces;
   a closing mechanism situated on the top surface of the body and adjacent to the first threaded region;
   an actuator in communication with the closing mechanism;
   a first pipe extending through the body to the closing mechanism;
   a second pipe extending through the body to the closing mechanism, wherein the first and second pipe form a flow path;
   a nut comprising:
      an interior surface comprising a second threaded region configured to attach to the first threaded region;
      an exterior surface opposite the interior surface; and
      a first threaded hole extending from the exterior surface toward the interior surface, wherein the first threaded hole is adjacent to the closing mechanism a temperature sensor connected to the first threaded hole.

2. The valve assembly of claim 1, wherein the bottom portion of the body comprises a first perpendicular sidewall and a second perpendicular sidewall opposite the first sidewall.

3. The valve assembly of claim 2, wherein the first pipe extends through the first perpendicular sidewall of the bottom portion of the body and towards the top portion.

4. The valve assembly of claim 2, wherein the second pipe extends through the second perpendicular sidewall of the bottom portion of the body and towards the top portion.

5. The valve assembly of claim 1, further comprising a second threaded hole extending into the body and adjacent to the first pipe.

6. The valve assembly of claim 5, wherein the second threaded hole is located a distance of 1 mm to 6 mm from the first pipe.

7. The valve assembly of claim 1, wherein the first threaded hole is located a distance of 1 mm to 6 mm from the closing mechanism.

8. The valve assembly of claim 1, wherein the nut further comprises a top plate that is parallel with closing mechanism and a side member extending downward from and perpendicular to the top plate.

9. The valve assembly of claim 8, wherein the first threaded hole is located in the top plate.

10. The valve assembly of claim 8, wherein the first threaded hole is located in the side member.

11. A valve assembly, comprising:
    a body comprising:
       a bottom portion; and
       a top portion comprising a threaded region, wherein the top portion is above the bottom portion;
    a flow path extending through the bottom portion and the top portion;
    a closing mechanism within the flow path;
    an actuator in communication with the closing mechanism;
    a nut configured to attach to the threaded region;
    a first threaded hole extending into the nut a temperature sensor connected to the first threaded hole.

12. The valve assembly of claim 11, wherein the nut comprises a top plate that is parallel with closing mechanism and a side member extending downward from and perpendicular to the top plate.

13. The valve assembly of claim 12, wherein the first threaded hole is located in the top plate of the nut.

14. The valve assembly of claim 12, wherein the first threaded hole is located in the side member.

15. The valve assembly of claim 11, further comprising a pipe extending through the bottom portion of the body and into the top portion of the body.

16. A system comprising, comprising:
  a valve assembly, comprising:
    a body comprising a first threaded region;
    a flow path extending through the body;
    a closing mechanism within the flow path;
    an actuator in communication with the closing mechanism;
    a nut comprising a second threaded region configured to attach to the first threaded region; and
    a threaded hole extending into the nut; and
  a temperature sensor connected to the threaded hole.

17. The system of claim 16, wherein the threaded hole is located adjacent to the closing mechanism.

18. The system of claim 16, wherein the threaded hole has a diameter in the range of 1 mm to 6 mm and a depth in the range of 1 mm to 6 mm.

\* \* \* \* \*